(12) United States Patent
Iwashige et al.

(10) Patent No.: US 8,729,715 B2
(45) Date of Patent: May 20, 2014

(54) EPOXY RESIN COMPOSITION FOR SEMICONDUCTOR ENCAPSULATION

(75) Inventors: Tomohito Iwashige, Osaka (JP);
Tomoaki Ichikawa, Osaka (JP);
Mitsuaki Fusumada, Osaka (JP);
Naoya Sugimoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/556,646

(22) Filed: Jul. 24, 2012

(65) Prior Publication Data
US 2013/0026662 A1    Jan. 31, 2013

(30) Foreign Application Priority Data

Jul. 25, 2011 (JP) ................. 2011-162305

(51) Int. Cl.
*H01L 23/29* (2006.01)

(52) U.S. Cl.
USPC .................... 257/788; 257/E23.119; 523/456

(58) Field of Classification Search
USPC .................... 257/788, E23.119; 523/456
See application file for complete search history.

(56) References Cited

U.S. PATENT DOCUMENTS

| | | | |
|---|---|---|---|
| 5,096,762 A * | 3/1992 | Yoshida et al. | 428/76 |
| 6,602,938 B1 * | 8/2003 | Iji et al. | 524/164 |
| 7,265,167 B2 * | 9/2007 | Akizuki et al. | 523/466 |
| 7,943,706 B2 * | 5/2011 | Kimura et al. | 525/524 |
| 2006/0204761 A1 * | 9/2006 | Ito | 428/413 |
| 2009/0133905 A1 * | 5/2009 | Kimura et al. | 174/254 |

FOREIGN PATENT DOCUMENTS

JP    8-153831 A    6/1996

* cited by examiner

*Primary Examiner* — Phuc Dang
(74) *Attorney, Agent, or Firm* — Sughrue Mion, PLLC (57) ABSTRACT

The present invention relates to an epoxy resin composition for semiconductor encapsulation, including the following components (A) to (D): (A) an epoxy resin; (B) a phenol resin; (C) an inorganic filler, and (D) a silicone compound containing an alkoxy group directly bonded to silicon atom in an amount of 10 to 45 wt % based on the entire silicone compound and having a specific gravity of 1.10 to 1.30.

6 Claims, 1 Drawing Sheet

EPOXY RESIN COMPOSITION FOR SEMICONDUCTOR ENCAPSULATION

FIELD OF THE INVENTION

The present invention relates to a semiconductor device reduced in warpage generation and excellent in the mounting reliability and soldering resistance. More specifically, the present invention relates to an epoxy resin composition for semiconductor encapsulation, which is used as an encapsulating material of a single-sided encapsulation-type semiconductor device, and a semiconductor device using the same.

BACKGROUND OF THE INVENTION

Conventionally, a semiconductor device has been fabricated by encapsulating various semiconductor elements such as transistor, IC and LSI with a ceramic package or the like, but in view of cost and mass productivity, resin encapsulation using a plastic package is recently predominating. In this type of resin encapsulation, an epoxy resin composition has been heretofore used and achieved good results.

However, technical innovation in the semiconductor field brings an increase in the integration degree and at the same time, drives large sizing of the element and miniaturization of the wiring, and the package also tends to become smaller and thinner. With this tendency, the encapsulating material is required to be more enhanced in reliability than ever. In recent years, to cope with requirement for more reduction in size and weight, the mode of package is transferring from QFP (Quad Flat Package) and SOP (Small Outline Package) to area-mounted package such as BGA (Ball Grid Array) including CSP (Chip Size Package) that is more respondent to multiple pins and allows for higher density mounting.

Meanwhile, the conventional package has a problem such as occurrence of separation between constituent members (mainly between an encapsulating resin and a die pad), which is attributable to a thermal stress generated between constituent members of a semiconductor device in the solder reflow step, and also in the recent single-sided resin encapsulation-type package, since the form thereof is single-sided encapsulation, deformation due to warpage in the solder reflow step is liable to occur, giving rise to a problem such as reduction in the mounting reliability. In order to solve this deformation problem attributable to warpage generation, irrespective of package configuration, it is greatly demanded to reduce the thermal stress generated due to difference in the linear expansion coefficient, modulus or the like between constituent members of the package, such as encapsulating resin and substrate.

The cause of generating warpage includes generation of a thermal stress due to (1) a large difference between the linear expansion coefficient of the substrate and the linear expansion coefficient of the encapsulating resin (that is, the linear expansion coefficient of the encapsulating resin is larger than that of the substrate) or (2) a large difference between the high-temperature modulus of the substrate and the high-temperature modulus of the encapsulating resin (that is, the high-temperature modulus of the encapsulating resin is larger than that of the substrate). Therefore, for reducing the linear expansion coefficient difference and the high-temperature modulus difference each responsible for generation of the thermal stress, studies are being made to increase the content of an inorganic filler in the encapsulating material (see, Patent Document 1).

Patent Document 1: JP-A-8-153831

SUMMARY OF THE INVENTION

The linear expansion coefficient of the encapsulating resin itself may be reduced (that is, be made close to the linear expansion coefficient of the substrate to reduce the difference between both members) by increasing the content of the inorganic filler, but the high-temperature modulus of the encapsulating resin rises (the difference from the substrate increases) and therefore, the effect in terms of inhibiting warpage generation is insufficient. Also, blending of other various additives is being studied, but as for the inhibition of warpage generation, a satisfactory effect is not obtained at present.

Under these circumstances, the present invention has been made, and an object of the present invention is to provide an epoxy resin composition for semiconductor encapsulation, ensuring that the linear expansion coefficient can be remarkably reduced while inhibiting an increase in the high-temperature modulus of the encapsulating resin, and a semiconductor device using the same.

Namely, the present invention relates to the following items (1) to (7).

(1) An epoxy resin composition for semiconductor encapsulation, including the following components (A) to (D):
 (A) an epoxy resin;
 (B) a phenol resin;
 (C) an inorganic filler; and
 (D) a silicone compound containing an alkoxy group directly bonded to silicon atom in an amount of 10 to 45 wt % based on the entire silicone compound and having a specific gravity of 1.10 to 1.30.

(2) The epoxy resin composition for semiconductor encapsulation according to item (1), in which the silicone compound as the component (D) is contained in an amount of 0.5 to 5.0 wt % based on the entire epoxy resin composition.

(3) The epoxy resin composition for semiconductor encapsulation according to item (1) or (2), in which the inorganic filler as the component (C) is contained in an amount of 70 to 92 wt % based on the entire epoxy resin composition.

(4) The epoxy resin composition for semiconductor encapsulation according to any one of items (1) to (3), in which the alkoxy group in the silicone compound as the component (D) contains at least a methoxy group.

(5) The epoxy resin composition for semiconductor encapsulation according to any one of items (1) to (4), in which the silicone compound as the component (D) has an organic substituent, and the organic substituent contains a phenyl group.

(6) A semiconductor device obtained by resin-encapsulating a semiconductor element with the epoxy resin composition for semiconductor encapsulation according to any one of items (1) to (5).

(7) The semiconductor device according to item (6), which is a single-sided resin encapsulation-type package.

The present inventors made many intensive studies to obtain a semiconductor encapsulating material capable of decreasing the linear expansion coefficient of a cured product of an epoxy resin composition and at the same time, inhibiting an increase in the high-temperature modulus, thereby exerting a sufficient effect in terms of inhibiting warpage generation. In this connection, the inhibition effect was studied from a different aspect unconventionally without relying on the blending of an inorganic filler. As a result, use of a silicone compound was envisaged, and there was obtained knowledge that among others, the amount of an alkoxy group directly bonded to silicon atom of a silicone compound and the specific gravity of the silicone compound itself are closely related to reduction in the linear expansion coefficient and the high-temperature modulus. Based on this knowledge, many studies have been further made, as a result, it has been found that use of a specific silicone compound containing an alkoxy group directly bonded to silicon atom in an amount of 10 to 45 wt % based on the entire silicone compound and having a specific gravity of 1.10 to 1.30 produces a more marked effect in reducing the linear expansion coefficient than the blending system of an inorganic filler heretofore generally known to be effective for linear expansion reduction, and by virtue of an associated decrease in thermal stress, the problem of separation between constituent members in the reflow step or the generation of warpage in the reflow step of a single-sided resin encapsulation-type package can be effectively, inhibited. The present invention has been achieved based on this finding.

In this way, the present invention is an epoxy resin composition for semiconductor encapsulation, including a silicone compound [component (D)] having an alkoxy group amount and a specific gravity each in a specific range. Thanks to this configuration, an encapsulating resin formed by using the composition as an encapsulating material can be reduced in the linear expansion coefficient while suppressing an increase in the high-temperature modulus, as a result, separation between constituent members of a semiconductor device or generation of warpage is prevented, and a semiconductor device with high reliability can be obtained.

When the content of the silicone compound as the component (D) is from 0.5 to 5.0 wt % based on the entire epoxy resin composition, precipitation of the silicone compound hardly occurs, and this is more effective in inhibiting generation of warpage.

Also, when the content of the inorganic filler as the component (C) is from 70 to 92 wt % based on the entire epoxy resin composition, this is effective, for example, in more reducing the amount of change in warpage at the reflow of a single-sided resin encapsulation-type package.

Furthermore, when the alkoxy group in the silicone compound as the component (D) contains at least a methoxy group, a higher effect of reducing the linear expansion coefficient can be exerted and this is effective in decreasing the warpage variation at reflow or enhancing the soldering resistance, When the silicone compound as the component (D) has an organic substituent and the organic substituent contains a phenyl group, a higher effect of reducing the high-temperature modulus of the encapsulating resin can be effectively exerted.

DETAILED DESCRIPTION OF THE INVENTION

The mode for carrying out the present invention is described below.

The epoxy resin composition for semiconductor encapsulation (hereinafter, sometimes simply referred to as an "epoxy resin composition") of the present invention is obtained using an epoxy resin (component (A)), a phenol resin (component (B)), an inorganic filler (component (C)) and a specific silicone compound (component (D)) and is usually in the form of a powder or a tablet formed by tabletting the powder.

<Epoxy Resin (Component (A))>

As for the epoxy resin (component (A)), various epoxy resins are used. Examples thereof include a bisphenol A-type epoxy resin, a phenol novolak-type epoxy resin, a cresol novolak-type epoxy resin, a biphenyl-type epoxy resin, and a triphenylmethane-type epoxy resin. One of these is used alone, or two or more thereof are used in combination. Among these epoxy resins, in view of reliability and moldability, it is preferred to use a biphenyl-type epoxy resin or a low moisture absorption-type epoxy resin in which a lower alkyl group is added to the phenyl ring. As such an epoxy resin, for example, an epoxy resin having an epoxy equivalent of 150 to 250 and a softening point or melting point of 50 to 130° C. is suitably used.

<Phenol Resin (Component (B))>

The phenol resin (component (B)) used together with the epoxy resin (component (A)) has an action as a curing agent for the epoxy resin (component (A)) and collectively indicates a monomer, an oligomer and a polymer each having two or more phenolic hydroxyl groups per one molecule thereof. Examples thereof include a phenol novolak resin, a cresol novolak resin, a biphenyl-type novolak resin, a triphenylmethane-type phenol resin, a naphthol novolak resin, a phenol aralkyl resin, and a biphenyl aralkyl resin. One of these resins is used alone, or two or more thereof are used in combination. Among these phenol resins, in view of reliability and moldability, it is preferred to use a low-hygroscopic resin such as phenol aralkyl resin and biphenyl aralkyl resin, or depending on the case, a phenol novolak resin.

With respect to the blending ratio of the epoxy resin (component (A)) and the phenol resin (component (B)), these resins are preferably blended such that the hydroxyl group equivalent in the phenol resin (component (B)) becomes from 0.5 to 1.5 equivalents, more preferably from 0.7 to 1.1 equivalents, still more preferably 0.8 to 1.0 equivalents, per one epoxy group equivalent in the epoxy resin.

<Inorganic Filler (Component (C))>

As for the inorganic filler (component (C)) used together with the components (A) and (B), various fillers are used, and examples thereof include a silica powder such as fused silica powder and crystalline silica powder, an alumina powder, talc, an aluminum nitride powder, and a silicon nitride powder. The inorganic filler can be used in any of, for example, crushed, spherical and ground forms. One of these inorganic fillers is used alone, or two or more thereof are used in combination. In particular, a silica powder is preferably used and among the silica powders above, in view of high filling property and high fluidity, use of a fused silica powder is more preferred. The fused silica powder includes a spherical fused silica powder and a crushed fused silica powder, but in view of fluidity, use of a spherical fused silica powder is preferred.

Also, from the standpoint of improving the fluidity, an inorganic filler (component (C)) having an average particle diameter of 5 to 40 μm is preferably used. Incidentally, the average particle diameter of the inorganic filler (component (C)) can be measured, for example, by using a commercially available laser diffraction/scattering particle size distribution analyzer after taking out an arbitrary measurement sample from the parent population.

The content of the inorganic filler (component (C)) is preferably set to a range of 70 to 92 wt %, more preferably from 84 to 92 wt %, based on the entire epoxy resin composition. Because, if the content of the inorganic filler (component (C)) is too small, the effect of decreasing the linear expansion coefficient by the blending of inorganic filler is reduced and the linear expansion coefficient of the epoxy resin composition is increased in the absolute value itself, as a result, the warpage variation at reflow tends to become large, whereas if the content of the inorganic filler (component (C) is too large, the fluidity of the epoxy resin composition is reduced and this tends to cause generation of wire flowing or non-filling.

<Specific Silicone Compound (Component (D))>

The specific silicone compound (component (D)) used together with the components (A) to (C) must satisfy the conditions that the specific gravity thereof is from 1.10 to 1.30 and the amount of an alkoxy group directly bonded to silicon atom is from 10 to 45 wt % based on the entire silicone compound. One of silicone compounds having such characteristics is used alone, or two or more thereof are used in combination.

The specific silicone compound (component (I))) need to have a specific gravity of 1.10 to 1.30, preferably 1.11 to 1.21. Because, if the specific gravity is too small, the effect of reducing the linear expansion coefficient can be hardly obtained, whereas if the specific gravity is too large, the high-temperature modulus rises.

Also, in the specific silicone compound (component (D)), the amount of an alkoxy group directly bonded to silicon atom needs to be from 10 to 45 wt %, preferably from 15 to 35 wt %, based on the entire silicone compound. Because, if the amount of the alkoxy group is too small, the effect of decreasing the linear expansion coefficient can be hardly obtained, whereas if the amount of the alkoxy group is too large, the specific gravity of the silicone compound becomes difficult to control.

The specific silicone compound (component (D)) for use in the present invention includes, for example, several commercial products. Alternatively, the compound may be also produced by synthesis. Examples of the commercial product for the specific silicone compound (D) include 3074 INTERMEDLATE and SR2402 produced by Dow Corning Toray Silicone Co., Ltd., TSR165 and XR31-B2230 produced by Momentive Performance Materials Inc., and KR-500 and KR213 produced by Shin-Etsu Chemical Co., Ltd.

Also, the specific silicone compound (component (D)) can be produced, for example, as follows. That is, an organochlorosilane, an organoalkoxysilane, a siloxane, or a partial hydrolysis condensate thereof, which can undergo a hydrolysis condensation reaction to form a silicone compound containing a structural unit represented by the following formula (a) and a structural unit represented by the following formula (b) and having a functional group with the terminal being selected from $R_1$, a hydroxyl group and an alkoxy group, is mixed in a mixed solution of an organic solvent capable of dissolving the raw material and the reaction product and water in an amount large enough to hydrolyze all hydrolyzable groups of the raw material, and a hydrolysis condensation reaction is allowed to proceed, whereby the specific silicone compound can be obtained.

(a)

(b)

in which $R_1$ is a substituted or unsubstituted monovalent hydrocarbon group having a carbon number of 1 to 12, and all $R_1$s present in the silicone compound may be the same or different.

At this time, the composition can be controlled to the predetermined specific gravity by adjusting the kind of the hydrocarbon group of $R_1$ in formulae (a) and (b) and can be controlled to the predetermined content of the alkoxy group by adjusting the condensation reaction time. As the catalyst for accelerating the reaction, an acid, a base or an organic metal compound is preferably added.

Examples of $R_1$ in formulae (a) and (b) include an alkyl group such as methyl group, ethyl group, propyl group, butyl group, isopropyl group, isobutyl group, tert-butyl group, pentyl group, hexyl group, heptyl group, octyl group and 2-ethylhexyl group; an alkenyl group such as vinyl group, allyl group, butenyl group, pentenyl group and hexenyl group; an aryl group such as phenyl group, tolyl group, xylyl group, naphthyl group and biphenyl group; and an aralkyl group such as benzyl group and phenethyl group. Of these, a methyl group and a phenyl group are preferred.

Examples of the organoalkoxysilane and siloxane used as the raw material when producing the specific silicone compound (component (D)) include methyltrimethoxysilane, methyltriethoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, methylphenyldimethoxysilane, methylvinyldimethoxysilane, phenylvinyldimethoxysilane, diphenyldimethoxysilane, methylphenyldiethoxysilane, methylvinyldiethoxysilane, phenylvinyldiethoxysilane, diphenyldiethoxysilane, dimethyldiethoxysilane, tetramethoxysilane, tetraethoxysilane, dimethoxydiethoxysilane, and hydrolysis condensates thereof. One of these is used alone, or two or more thereof are used in combination.

As regards the specific silicone compound (component (D)), in view of low linear expansion of the epoxy resin composition as the encapsulating material, the alkoxy group in the silicone compound preferably contains at least a methoxy group. Furthermore, as for the organic substituent present in the specific silicone compound (component (D)), in view of high-temperature (from 170 to 260° C.) modulus of the epoxy resin composition as the encapsulating material, the organic substituent preferably contains a phenyl group.

The content of the specific silicone compound (component (D)) is preferably set to a range of 0.5 to 5.0 wt %, preferably from 1.0 to 4.0 wt %, based on the entire epoxy resin composition. Because, if the content of the specific silicone compound (component (D)) is too small, it tends to become difficult to sufficiently exert the effect of inhibiting warpage generation, whereas if the content is too large, there is a tendency that the cured product of the epoxy resin composition is greatly reduced in the bending strength or due to bleed out (leaching) of the silicone compound, releasability from the molding die is impaired.

<Various Additives>

In the epoxy resin composition for semiconductor encapsulation, if desired, other additives such as curing accelerator, silane coupling agent, flame retardant, flame retarding aid, release agent, ion trapping agent, pigment/colorant (e.g., carbon black), stress-reducing agent and tackifier may be appropriately blended, in addition to the components (A) to (D).

Examples of the curing accelerator include a phosphorus-based compound, and conventionally known tertiary amines, quaternary ammonium salts, imidazoles and boron compounds. One of these is used alone, or two or more thereof are used in combination. Above all, use of an imidazole compound represented by formula (I) is preferred in view of moldability/curability. Specific examples of such an imidazole compound include 2-phenyl-4-methyl-5-hydroxymethylimidazole.

(1)

in which $R_2$ is an alkyl group or an aryl group, and $R_3$ and $R_4$ are —$CH_3$ or —$CH_2OH$ and may be the same or different, provided that at least one of $R_3$ and $R_4$ is —$CH_2OH$.

The content of the curing accelerator is preferably set to be from 0.001 to 8.0 wt %, more preferably from 0.01 to 3.0 wt %, based on the epoxy resin (component (A)).

As for the silane coupling agent, a silane coupling agent having two or more alkoxy groups is suitably used. Specific examples thereof include 3-methacryloxypropyltrimethoxysilane, β-(3,4-epoxycyclohexyl)ethyltrimethoxysilane, γ-glycidoxypropyltrimethoxysilane, γ-mercaptopropyltrimethoxysilane, γ-(2-aminoethyl)aminopropyltrimethoxysilane, γ-mercaptopropylmethyldimethoxysilane, γ-anilinopropyltrimethoxysilane, and hexamethyldisilazane. One of these is used alone, or two or more thereof are used in combination.

Examples of the flame retardant include a novolak-type brominated epoxy resin and a metal hydroxide. Also, examples of the flame retarding aid include diantimony trioxide and diantimony pentoxide. One of these is used alone, or two or more thereof are used in combination.

Examples of the release agent include a compound such as higher aliphatic acid, higher aliphatic acid ester and higher aliphatic acid calcium salt, and, for example, a carnauba wax and a polyethylene-based wax are used. One of these is used alone, or two or more thereof are used in combination.

As for the ion trapping agent, all known compounds having an ion trapping ability can be used, and, for example, hydrotalcites, bismuth hydroxide and yttrium oxide are used. One of these is used alone, or two or more thereof are used in combination.

Examples of the stress-reducing agent include a butadiene-based rubber such as methyl acrylate-butadiene-styrene copolymer and methyl methacrylate-butadiene-styrene copolymer, and a silicone compound. One of these is used alone, or two or more thereof are used in combination.

The epoxy resin composition for semiconductor encapsulation of the present invention can be produced, for example, as follows. That is, the components (A) to (D) and, if desired, other additives are blended and mixed, and the mixture is charged into a kneader such as mixing roll machine and melt-kneaded in a heated state. The kneaded product is then subjected to a series of steps including solidification by cooling to room temperature, pulverization by conventional means, and, if desired, tabletting, whereby the target epoxy resin composition can be produced.

<Semiconductor Device>

The method for encapsulating a semiconductor element by using the epoxy resin composition obtained as above is not particularly limited and may be performed by a conventional molding method such as normal transfer molding, whereby a semiconductor device is manufactured. Examples of the thus-obtained semiconductor device include a semiconductor device such as IC and LSI.

Figure 1:
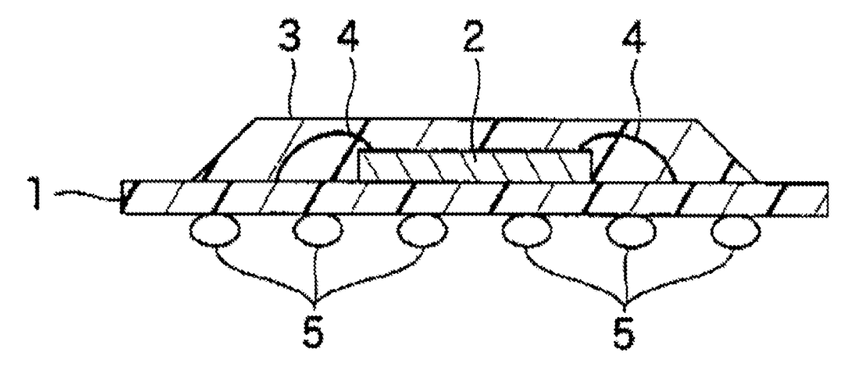
FIG. 1 is a cross-sectional view schematically showing the single-sided resin encapsulation-type package.

The semiconductor device of the present invention obtained in such a way includes, for example, a single-sided resin encapsulation-type package shown in FIG. 1. This single-sided resin encapsulation-type package is in a state where a semiconductor element is mounted on a semiconductor element-mounting substrate 1 such as bismaleimide-triazine (BT) resin and only the mounting surface side is resin-encapsulated with an encapsulating resin 3. In FIG. 1, 4 is a bonding wire connecting the semiconductor element 2 and the circuit portion (not shown) on the semiconductor element-mounting substrate 1, and 5 is a solder terminal for connection formed on the other surface of the semiconductor element-mounting substrate 1.

EXAMPLES

In the following, Examples are described together with Comparative Examples. However, the present invention is not limited to these Examples. In Examples and Comparative Examples, "wt %" means % by weight.

The components shown below were prepared. Incidentally, Silicone Compounds d1 to d18 are a compound having structural units represented by formulae (a) and (b), and the organic group ($R_1$) contained is shown by each compound. Each of the silicone compounds was produced by synthesis in accordance with the above-described synthesis method, and, for example, the kind of the organic substituent and the condensation reaction time were appropriately adjusted to give the desired specific gravity and alkoxy group content.

[Epoxy Resin a1]
Biphenyl-type epoxy resin (epoxy equivalent: 192, melting point: 105° C.)

[Epoxy Resin a2]
Triphenylmethane-type polyfunctional epoxy resin (epoxy equivalent: 169, melting point: 60° C.)

[Phenol Resin b1]
Biphenyl aralkyl-type phenol resin (hydroxyl group equivalent: 203, softening point: 65° C.)

[Phenol Resin b2]
Phenol novolak resin (hydroxyl group equivalent: 104, softening point: 60° C.)

[Phenol Resin b3]
Triphenylmethane-type phenol resin (hydroxyl group equivalent: 97, softening point: 111° C.)

[Curing Accelerator]
2-Phenyl-4-methyl-5-hydroxymethylimidazole

[Silicone Compound d1] (Example)
Specific gravity: 1.155, alkoxy group content: 18 wt % (methoxy group), organic substituent: phenyl group/methyl group

[Silicone Compound d2] (Example)
Specific gravity: 1.155, alkoxy group content: 31 wt % (methoxy group), organic substituent: methyl group

[Silicone Compound d3] (Example)
Specific gravity: 1.21, alkoxy group content: 18 wt % (methoxy group), organic substituent: phenyl group

[Silicone Compound d4] (Example)
Specific gravity: 1.13, alkoxy group content: 15 wt % (methoxy group), organic substituent: phenyl group/methyl group

[Silicone Compound d5] (Example)
Specific gravity: 1.12, alkoxy group content: 35 wt % (methoxy group), organic substituent: methyl group

[Silicone Compound d6] (Example)
Specific gravity: 1.13, alkoxy group content: 14 wt % (methoxy group), organic substituent: methyl group

[Silicone Compound d7] (Example)
Specific gravity: 1.13, alkoxy group content: 30 wt % (methoxy group), organic substituent: phenyl group/methyl group

[Silicone Compound d8] (Example)
Specific gravity: 1.15, alkoxy group content: 30 wt % (methoxy group), organic substituent: methyl group

[Silicone Compound d9] (Example)
Specific gravity: 1.11, alkoxy group content: 22 wt % (methoxy group), organic substituent: phenyl group/methyl group

[Silicone Compound d10] (Example)
Specific gravity: 1.11, alkoxy group content: 15 wt % (methoxy group), organic substituent: phenyl group/methyl group

[Silicone Compound d11] (Comparative Example)
Specific gravity: 1.07, alkoxy group content: 25 wt % (methoxy group), organic substituent: methyl group

[Silicone Compound d12] (Comparative Example)
Specific gravity: 1.07, alkoxy group content: 17 wt % (methoxy group), organic substituent: phenyl group/methyl group

[Silicone Compound d13] (Comparative Example)
Specific gravity: 1.25, alkoxy group content: 0 wt %, organic substituent: phenyl group

[Silicone Compound d14] (Comparative Example)
Specific gravity: 1.25, alkoxy group content: 0 wt %, organic substituent: phenyl group/propyl group

[Silicone Compound d15] (Comparative Example)
Specific gravity: 1.33, alkoxy group content: 0 wt %, organic substituent: phenyl group/methyl group

[Silicone Compound d16] (Comparative Example)
Specific gravity: 1.25, alkoxy group content: 1 wt % (propoxy group), organic substituent: methyl group

[Silicone Compound d17] (Comparative Example)
Specific gravity: 1.55, alkoxy group content: 4 wt % (methoxy group), organic substituent: phenyl group

[Silicone Compound d18] (Comparative Example)
Specific gravity: 1.09, alkoxy group content: 40 wt % (methoxy group), organic substituent: methyl group

[Inorganic Filler (additional filler is also the same)]
Spherical fused silica powder (average particle diameter: 13 μm)

[Pigment]
Carbon black

[Flame Retardant]
Magnesium hydroxide

[Silane Coupling Agent]
3-Methacryloxypropyltrimethoxysilane

[Release Agent]
Polyethylene oxide wax

[Examples 1 to 13 and Comparative Examples 1 to 14]
Respective components shown in Tables 1 to 6 later were mixed in the ratio shown in the same Tables and thoroughly mixed by a mixer, and the mixture was melt-kneaded at 100° C. for 2 minutes by using a twin-screw kneader. The obtained melt was cooled, and the resulting solid was pulverized into a powder to produce the target powdery epoxy resin composition.

Using the thus-obtained epoxy resin compositions of Examples and Comparative Examples, measurements and evaluations were performed according to the following methods. Incidentally, molding of the epoxy resin composition was performed by a transfer molding machine under the conditions of a molding temperature of 175° C. and a molding time of 90 seconds. Also, the post-curing was performed under the conditions of 175° C. and 3 hours. These results are shown together in Tables 1 to 6 later.

(1) TMA Measurement (calculation of reduction ratio of linear expansion coefficient/index of effect of decreasing linear expansion coefficient)

Each of the epoxy resin compositions of Examples and Comparative Examples was molded into a test piece with a size of 3 mm (W)×3 mm (D)×20 mm (H) under the molding conditions above and then post-cured under the conditions above to produce a test piece for TMA measurement. The dimension in the height direction of the test piece was measured by temperature rise measurement at a temperature rise rate of 5° C./min in a temperature range of 25 to 260° C. by a compression method (load: 0.05 N) in a thermal mechanical analyzer (Q400) manufactured by TA Instruments, and the linear expansion coefficient (CTE2) in a temperature range of 170 to 260° C. was calculated.

Incidentally, with respect to the materials of the same epoxy resin-phenol resin system, the CTE2 value of a sample composed of a standard resin system (resin systems 1, 2 and 3 in which the silicone compound was not added) was subtracted from the CTE2 value of each test piece containing a predetermined amount of various silicone compounds (subtraction), the obtained value is divided by the amount added of the silicone compound (division), and the resulting value is defined as the "CTE2 reduction ratio".

That is, using the linear expansion coefficient of each sample (each Example, each Comparative Example) measured, the reduction ratio of linear expansion coefficient (CTE2 reduction ratio; ppm/wt %) was calculated according to the following (1) to (3):

(1) In Case of Examples 1 to 11 and Comparative Examples 1 to 10

$$\text{Reduction ratio of linear expansion coefficient per amount of silicone compound blended (CTE2 reduction ratio; ppm/wt \%)} = [(\text{CTE2 of each sample} - \text{CTE2 of resin system 1})/\text{amount of silicone compound blended}] \times 100$$

(2) In Case of Example 12 and Comparative Examples 11 and 12

$$\text{Reduction ratio of linear expansion coefficient per amount of silicone compound blended (CTE2 reduction ratio; ppm/wt \%)} = [(\text{CTE2 of each sample} - \text{CTE2 of resin system 2})/\text{amount of silicone compound blended}] \times 100$$

(3) In Case of Example 13 and Comparative Examples 13' and 14

$$\text{Reduction ratio of linear expansion coefficient per amount of silicone compound blended (CTE2 reduction ratio; ppm/wt \%)} = [(\text{CTE2 of each sample} - \text{CTE2 of resin system 3})/\text{amount of silicone compound blended}] \times 100$$

The sample was rated "A" when the value above was smaller than the value (CTE2 reduction ratio caused by the addition of the inorganic filler) obtained by subtracting the CTE2 value of a sample composed of a standard resin system (resin systems 1, 2 and 3 in which the silicone compound was not added) from the CTE2 value of a test piece (Comparative Example 1, Comparative Example 11, Comparative Example 13) produced by additionally adding the same amount of the inorganic filler in place of the silicone compound (subtraction) and dividing the obtained value by the amount of the additionally added inorganic filler (division) (the value of CTE2 reduction ratio was from −4.5 to −3.05), rated "AA" when greatly smaller (the value of CTE2 reduction ratio was less than −4.5), rated "B" when larger (the value of CTE2 reduction ratio was from more than −3.05 to −2.0), and rated "C" when greatly larger (the value of CTE2 reduction ratio was more than −2.0). Based on these results, the effect of decreasing CTE2 was judged.

(2) DMA Measurement (measurement of 260° C. high-temperature modulus/index of effect on high-temperature modulus)

Each of the epoxy resin compositions of Examples and Comparative Examples was molded into a test piece with a size of 5 mm (W)×50 mm (L)×1 mm (T) under the molding conditions above and then post-cured under the conditions above to produce a test piece for DMA measurement. The test piece was subjected to three-point bending measurement by using a viscoelasticity measuring apparatus (RSA3) manufactured by TA Instruments. More specifically, temperature rise measurement was performed under the conditions of a vibration strain of 0.04%, a frequency of 1 Hz, a temperature range of 25 to 260° C. and a temperature rise rate of 10° C./min, and the value of storage modulus E' at 260° C. was read. The sample was rated "AA" when the value above was smaller than 1.0 GPa, rated "A" when from 1.0 GPa to less than 1.7 GPa, and rated "B" when 1.7 GPa or more, and the effect on high-temperature modulus was judged (degree of effect on high-temperature modulus).

(3) Warpage Amount (calculation of reduction ratio of warpage variation/index of effect of decreasing warpage variation)

Using each of the epoxy resin compositions of Examples and Comparative Examples, a semiconductor element was transfer-molded under the conditions above to obtain a single-sided resin encapsulation-type package. The obtained single-sided resin encapsulation-type package was used for warpage evaluation. That is, as shown in FIG. 1, an Si chip (size: 30 mm×30 mm×0.2 mm (thickness)) 2 as a semiconductor element was mounted and fixed on a BT resin (produced by JCI) (size: 49 mm×49 mm×0.21 mm (thickness)) 1 as a semiconductor element-mounting substrate, and only the mounting surface side was resin-encapsulated using each epoxy resin composition obtained above (size of encapsulating resin 3: 49 mm×49 mm×0.7 mm (thickness)), whereby a single-sided encapsulation-type semiconductor device was manufactured. In FIG. 1, 4 is a bonding wire connecting the Si chip 2 and the circuit portion (not shown) on the BT resin 1, and S is a solder terminal formed on the other surface of the BT resin 1.

With respect to each of the thus-obtained semiconductor devices, the package after post-curing was monitored in the long-side direction by a temperature-variable three-dimensional profile measuring system (composed of three components of a reflow scope/wide view core9055a manufactured by Cores Corporation, a camera FAST CAM MH4-10K manufactured by Photron, and a warpage analysis software Vic-3D produced by Correlated Solutions, inc.), and the displacement in the height direction was measured. The difference between the maximum value and the minimum value was defined as warpage. The warpage of the molded product obtained was measured in a temperature range of 25 to 260° C., and the maximum value-minimum value in the measurement was calculated as the warpage variation at reflow.

Next, to what extent (to what %) the warpage variation at reflow of the single-sided resin encapsulation-type package containing a predetermined amount of various silicone compounds was reduced as compared with the warpage variation at reflow of a single-sided resin encapsulation-type package of a standard resin system (resin systems 1, 2 and 3 not containing a silicone compound) was calculated, and a value obtained by dividing the calculated value by the amount added of the silicone compound (division) was defined as the "reduction ratio of warpage variation at reflow".

That is, using the warpage variation of each sample (each Example, each Comparative Example) measured, the reduction ratio (%) of warpage variation at reflow was calculated according to the following (1) to (3):

(1) In Case of Examples 1 to 11 and Comparative Examples 1 to 10

Reduction ratio (%) of warpage variation at reflow=
[(warpage variation of each sample−warpage variation of resin system 1)/amount of silicone compound blended]×100

(2) In Case of Example 12 and Comparative Examples 11 and 12

Reduction ratio (%) of warpage variation at reflow=
[(warpage variation of each sample−warpage variation of resin system 2)/amount of silicone compound blended]×100

(3) In Case of Example 13 and Comparative Examples 13 and 14

Reduction ratio (%) of warpage variation at reflow=
[(warpage variation of each sample−warpage variation of resin system 3)/amount of silicone compound blended]×100

The sample was rated "A" when the calculated reduction ratio of warpage variation at reflow was smaller than the reduction ratio of warpage variation at reflow in the case of additionally adding the inorganic filler (Comparative Example 1, Comparative Example 11, Comparative Example 13) (the value was from −12 to −8.75%) (the effect of decreasing the warpage variation at reflow was high), rated "AA" when greatly smaller (the value was less than −12%), rated "B" when larger (the value was from more than −8.75% to −5%) (the effect of decreasing the warpage variation at reflow was low), and rated "C" when greatly larger (the value was more than −5%). Based on these results, the effect of decreasing the warpage variation at reflow was judged.

<Examples in Resin System 1 (Standard)>

TABLE 1

(wt %)

| | | Resin System 1 | Examples (Examples in Resin System 1) | | | | | | | | | | |
|---|---|---|---|---|---|---|---|---|---|---|---|---|---|
| | | | 1 | 2 | 3 | 4 | 5 | 6 | 7 | 8 | 9 | 10 | 11 |
| Epoxy resin (A) | a1 | 6.55 | 5.83 | 4.43 | 4.43 | 4.43 | 4.43 | 4.43 | 4.43 | 4.43 | 4.43 | 4.43 | 4.43 |
| | a2 | — | — | — | — | — | — | — | — | — | — | — | — |

TABLE 1-continued

| | | Resin System 1 | \multicolumn{11}{c}{Examples (Examples in Resin System 1) (wt %)} |
|---|---|---|---|---|---|---|---|---|---|---|---|---|---|
| | | | 1 | 2 | 3 | 4 | 5 | 6 | 7 | 8 | 9 | 10 | 11 |
| Phenol resin (B) | b1 | 3.03 | 2.71 | 2.05 | 2.05 | 2.05 | 2.05 | 2.05 | 2.05 | 2.05 | 2.05 | 2.05 | 2.05 |
| | b2 | 1.30 | 1.16 | 0.88 | 0.88 | 0.88 | 0.88 | 0.88 | 0.88 | 0.88 | 0.88 | 0.88 | 0.88 |
| | b3 | — | — | — | — | — | — | — | — | — | — | — | — |
| Curing accelerator | | 0.30 | 0.27 | 0.20 | 0.20 | 0.20 | 0.20 | 0.20 | 0.20 | 0.20 | 0.20 | 0.20 | 0.20 |
| Inorganic filler (additional) | | — | — | — | — | — | — | — | — | — | — | — | — |
| Silicone compound (D) | d1 | — | 1.21 | 3.62 | — | — | — | — | — | — | — | — | — |
| | d2 | — | — | — | 3.62 | — | — | — | — | — | — | — | — |
| | d3 | — | — | — | — | 3.62 | — | — | — | — | — | — | — |
| | d4 | — | — | — | — | — | 3.62 | — | — | — | — | — | — |
| | d5 | — | — | — | — | — | — | 3.62 | — | — | — | — | — |
| | d6 | — | — | — | — | — | — | — | 3.62 | — | — | — | — |
| | d7 | — | — | — | — | — | — | — | — | 3.62 | — | — | — |
| | d8 | — | — | — | — | — | — | — | — | — | 3.62 | — | — |
| | d9 | — | — | — | — | — | — | — | — | — | — | 3.62 | — |
| | d10 | — | — | — | — | — | — | — | — | — | — | — | 3.62 |
| Inorganic filler (C) | | 87.81 | 87.81 | 87.81 | 87.81 | 87.81 | 87.81 | 87.81 | 87.81 | 87.81 | 87.81 | 87.81 | 87.81 |
| Pigment | | 0.51 | 0.51 | 0.51 | 0.51 | 0.51 | 0.51 | 0.51 | 0.51 | 0.51 | 0.51 | 0.51 | 0.51 |
| Flame retardant | | 0.10 | 0.10 | 0.10 | 0.10 | 0.10 | 0.10 | 0.10 | 0.10 | 0.10 | 0.10 | 0.10 | 0.10 |
| Silane coupling agent | | 0.15 | 0.15 | 0.15 | 0.15 | 0.15 | 0.15 | 0.15 | 0.15 | 0.15 | 0.15 | 0.15 | 0.15 |
| Release agent | | 0.25 | 0.25 | 0.25 | 0.25 | 0.25 | 0.25 | 0.25 | 0.25 | 0.25 | 0.25 | 0.25 | 0.25 |
| Characteristics of silicone compound | Specific gravity | — | 1.155 | 1.155 | 1.155 | 1.21 | 1.13 | 1.12 | 1.13 | 1.13 | 1.15 | 1.11 | 1.11 |
| | Alkoxy group amount (wt %) | — | 18 | 18 | 31 | 18 | 15 | 35 | 14 | 30 | 30 | 22 | 15 |
| CTE2 Reduction ratio (ppm/wt %) | | — | −5.74 | −5.77 | −3.24 | −3.24 | −3.92 | −3.58 | −3.08 | −3.20 | −3.65 | −4.84 | −3.86 |
| Effect of decreasing CTE2 | | — | AA | AA | A | A | A | A | A | A | A | AA | A |
| Modulus at 260° C. (GPa) | | 0.66 | 0.69 | 0.72 | 1.29 | 0.78 | 0.46 | 1.55 | 1.33 | 0.98 | 1.62 | 0.48 | 0.45 |
| Degree of effect on modulus | | AA | AA | AA | A | AA | AA | A | A | AA | A | AA | AA |
| Reduction ratio of warpage variation (%/wt %) | | — | −16.56 | −16.61 | −9.32 | −9.32 | −13.90 | −10.30 | −8.87 | −9.22 | −10.52 | −16.55 | −13.74 |
| Effect of decreasing warpage variation at reflow | | — | AA | AA | A | A | AA | A | A | A | A | AA | AA |

As apparent from the results in Table 1, in the standard resin system 1, all of the epoxy resin compositions containing a silicone compound having an alkoxy group amount and a specific gravity each falling in the specific range specified in the present invention (products of Examples 1 to 11) have a large effect of decreasing the linear expansion coefficient (CTE2) and a good degree of effect on modulus and in turn, have a great effect of decreasing the warpage variation at reflow. Above all, in Examples 1, 2, 4, 5, 8, 10 and 11 which are an epoxy resin composition using a silicone compound of a type where the organic substituent contains a phenyl group, it can be confirmed that the high-temperature modulus is a low modulus and reflecting this, a more excellent decreasing effect is provided on warpage characteristics at reflow.

<Examples in Resin System 2 (Standard)>

TABLE 2

[Examples in Resin System 2]

| | | Resin System 2 | Example 12 (wt %) |
|---|---|---|---|
| Epoxy resin (A) | a1 | 7.27 | 4.92 |
| | a2 | — | — |
| Phenol resin (B) | b1 | — | — |
| | b2 | — | — |
| | b3 | 3.69 | 2.49 |
| Curing accelerator | | 0.22 | 0.15 |
| Inorganic filler (additional) | | — | — |
| Silicone compound (D) | d1 | — | 3.62 |
| | d2 | — | — |
| | d3 | — | — |
| | d4 | — | — |
| | d5 | — | — |
| | d6 | — | — |
| | d7 | — | — |
| | d8 | — | — |
| | d9 | — | — |
| | d10 | — | — |
| Inorganic filler (C) | | 87.81 | 87.81 |
| Pigment | | 0.51 | 0.51 |
| Flame retardant | | 0.10 | 0.10 |
| Silane coupling agent | | 0.15 | 0.15 |
| Release agent | | 0.25 | 0.25 |
| Characteristics of silicone compound | Specific gravity | — | 1.155 |
| | Alkoxy group amount (wt %) | — | 18 |
| CTE2 Reduction ratio (ppm/wt %) | | — | −5.79 |
| Effect of decreasing CTE2 | | — | AA |
| Modulus at 260° C. (GPa) | | 1.18 | 1.20 |
| Degree of effect on modulus | | A | A |
| Reduction ratio of warpage variation (%/wt %) | | — | −16.96 |
| Effect of decreasing warpage variation at reflow | | — | AA |

Examples in Resin System 3 (Standard)

TABLE 3

[Examples in Resin System 3]

| | | Resin System 3 | Example 13 (wt %) |
|---|---|---|---|
| Epoxy resin (A) | a1 | — | — |
| | a2 | 5.02 | 3.40 |
| Phenol resin (B) | b1 | — | — |
| | b2 | — | — |
| | b3 | 6.03 | 4.08 |
| Curing accelerator | | 0.12 | 0.08 |
| Inorganic filler (additional) | | — | — |
| Silicone compound (D) | d1 | — | 3.62 |
| | d2 | — | — |
| | d3 | — | — |
| | d4 | — | — |
| | d5 | — | — |
| | d6 | — | — |
| | d7 | — | — |
| | d8 | — | — |
| | d9 | — | — |
| | d10 | — | — |
| Inorganic filler (C) | | 87.81 | 87.81 |
| Pigment | | 0.51 | 0.51 |
| Flame retardant | | 0.10 | 0.10 |
| Silane coupling agent | | 0.15 | 0.15 |
| Release agent | | 0.25 | 0.25 |
| Characteristics of silicone compound | Specific gravity | — | 1.155 |
| | Alkoxy group amount (wt %) | — | 18 |
| CTE2 Reduction ratio (ppm/wt %) | | — | −5.80 |
| Effect of decreasing CTE2 | | — | AA |
| Modulus at 260° C. (GPa) | | 1.31 | 1.33 |
| Degree of effect on modulus | | A | A |
| Reduction ratio of warpage variation (%/wt %) | | — | −16.71 |
| Effect of decreasing warpage variation at reflow | | — | AA |

As seen from the results in Tables 2 and 3, also in the resin system 2 (Table 2) and the resin system 3 (Table 3) where the combination of the epoxy resin and the phenol resin was changed from that in the resin system 1, both of the epoxy resin compositions containing a silicone compound having an alkoxy group amount and a specific gravity each falling in the specific range specified in the present invention (Examples 12 and 13) have a large effect of decreasing the linear expansion coefficient (CTE2) and a good degree of effect on the modulus and in turn, have a great effect of decreasing the warpage variation at reflow.

Comparative Examples in Resin System 1 (Standard)

TABLE 4

| | | Resin System 1 | \multicolumn{10}{c}{Comparative Examples (Comparative Examples in Resin System 1) (wt %)} |
|---|---|---|---|---|---|---|---|---|---|---|---|---|
| | | | 1 | 2 | 3 | 4 | 5 | 6 | 7 | 8 | 9 | 10 |
| Epoxy resin (A) | a1 | 6.55 | 4.43 | 4.43 | 4.43 | 5.83 | 4.43 | 4.43 | 4.43 | 4.43 | 4.43 | 4.43 |
| | a2 | — | — | — | — | — | — | — | — | — | — | — |
| Phenol resin (B) | b1 | 3.03 | 2.05 | 2.05 | 2.05 | 2.71 | 2.05 | 2.05 | 2.05 | 2.05 | 2.05 | 2.05 |
| | b2 | 1.30 | 0.88 | 0.88 | 0.88 | 1.16 | 0.88 | 0.88 | 0.88 | 0.88 | 0.88 | 0.88 |
| | b3 | — | — | — | — | — | — | — | — | — | — | — |
| Curing accelerator | | 0.30 | 0.20 | 0.20 | 0.20 | 0.27 | 0.20 | 0.20 | 0.20 | 0.20 | 0.20 | 0.20 |
| Inorganic filler (additional) | | — | 3.62 | — | — | — | — | — | — | — | — | — |
| Silicone compound (D) | d11 | — | — | 3.62 | — | — | — | — | — | — | — | — |
| | d12 | — | — | — | 3.62 | — | — | — | — | — | — | — |
| | d13 | — | — | — | — | 1.21 | 3.62 | — | — | — | — | — |
| | d14 | — | — | — | — | — | — | 3.62 | — | — | — | — |
| | d15 | — | — | — | — | — | — | — | 3.62 | — | — | — |
| | d16 | — | — | — | — | — | — | — | — | 3.62 | — | — |
| | d17 | — | — | — | — | — | — | — | — | — | 3.62 | — |
| | d18 | — | — | — | — | — | — | — | — | — | — | 3.62 |
| Inorganic filler (C) | | 87.81 | 87.81 | 87.81 | 87.81 | 87.81 | 87.81 | 87.81 | 87.81 | 87.81 | 87.81 | 87.81 |
| Pigment | | 0.51 | 0.51 | 0.51 | 0.51 | 0.51 | 0.51 | 0.51 | 0.51 | 0.51 | 0.51 | 0.51 |
| Flame retardant | | 0.10 | 0.10 | 0.10 | 0.10 | 0.10 | 0.10 | 0.10 | 0.10 | 0.10 | 0.10 | 0.10 |
| Silane coupling agent | | 0.15 | 0.15 | 0.15 | 0.15 | 0.15 | 0.15 | 0.15 | 0.15 | 0.15 | 0.15 | 0.15 |
| Release agent | | 0.25 | 0.25 | 0.25 | 0.25 | 0.25 | 0.25 | 0.25 | 0.25 | 0.25 | 0.25 | 0.25 |
| Characteristics of silicone compound | Specific gravity | — | — | 1.07 | 1.07 | 1.25 | 1.25 | 1.25 | 1.33 | 1.25 | 1.55 | 1.09 |
| | Alkoxy group amount (wt %) | — | — | 25 | 17 | 0 | 0 | 0 | 0 | 1 | 4 | 40 |
| CTE2 Reduction ratio (ppm/wt %) | | — | −3.04 | −2.09 | −2.60 | 0.31 | −0.04 | −0.11 | −0.11 | −1.68 | −2.70 | −2.81 |
| Effect of decreasing CTE2 | | — | B | B | B | C | C | C | C | C | B | B |
| Modulus at 260° C. (GPa) | | 0.66 | 1.70 | 1.09 | 0.68 | 0.72 | 0.93 | 0.92 | 0.93 | 1.08 | 1.22 | 1.68 |
| Degree of effect on modulus | | AA | B | A | AA | AA | AA | AA | AA | A | A | A |
| Reduction ratio of warpage variation (%/wt %) | | — | −8.75 | −6.02 | −7.49 | −0.89 | −0.11 | −0.32 | −0.32 | −4.82 | −7.77 | −8.10 |
| Effect of decreasing warpage variation at reflow | | — | B | B | B | C | C | C | C | C | B | B |

As seen from the results in Table 4, in the standard resin system 1, all of the epoxy resin compositions containing a silicone compound having an alkoxy group amount and a specific gravity with at least either one being out of the specific range specified in the Present invention (products of Comparative Examples 2 to 10) have a small effect of decreasing the linear expansion coefficient (CTE2) and in turn, also a low effect of decreasing the warpage variation at reflow.

<Comparative Examples in Resin System 2 (Standard)>

TABLE 5

Comparative Examples in Resin System 2

| | | | | (wt %) Comparative Example | |
|---|---|---|---|---|---|
| | | | Resin System 2 | 11 | 12 |
| Epoxy resin (A) | | a1 | 7.27 | 4.92 | 4.92 |
| | | a2 | — | — | — |
| Phenol resin (B) | | b1 | — | — | — |
| | | b2 | — | — | — |
| | | b3 | 3.69 | 2.49 | 2.49 |
| Curing accelerator | | | 0.22 | 0.15 | 0.15 |
| Inorganic filler (additional) | | | — | 3.62 | — |
| Silicone compound (D) | | d11 | — | — | — |
| | | d12 | — | — | — |
| | | d13 | — | — | 3.62 |
| | | d14 | — | — | — |
| | | d15 | — | — | — |
| | | d16 | — | — | — |
| | | d17 | — | — | — |
| | | d18 | — | — | — |
| Inorganic filler (C) | | | 87.81 | 87.81 | 87.81 |
| Pigment | | | 0.51 | 0.51 | 0.51 |
| Flame retardant | | | 0.10 | 0.10 | 0.10 |
| Silane coupling agent | | | 0.15 | 0.15 | 0.15 |
| Release agent | | | 0.25 | 0.25 | 0.25 |
| Characteristics of silicone compound | Specific gravity | | — | — | 1.25 |
| | Alkoxy group amount (wt %) | | — | — | 0 |
| CTE2 Reduction ratio (ppm/wt %) | | | — | −3.04 | −0.04 |
| Effect of decreasing CTE2 | | | — | B | C |
| Modulus at 260° C. (GPa) | | | 1.18 | 2.11 | 1.31 |
| Degree of effect on modulus | | | A | B | A |
| Reduction ratio of warpage variation (%/wt %) | | | — | −8.77 | −0.25 |
| Effect of decreasing warpage variation at reflow | | | — | B | C |

<Comparative Examples in Resin System 3 (Standard)>

TABLE 6

Comparative Examples in Resin System 3

| | | | | (wt %) Comparative Example | |
|---|---|---|---|---|---|
| | | | Resin System 3 | 13 | 14 |
| Epoxy resin (A) | | a1 | — | — | — |
| | | a2 | 5.02 | 3.40 | 3.40 |
| Phenol resin (B) | | b1 | — | — | — |
| | | b2 | — | — | — |
| | | b3 | 6.03 | 4.08 | 4.08 |
| Curing accelerator | | | 0.12 | 0.08 | 0.08 |
| Inorganic filler (additional) | | | — | 3.62 | — |
| Silicone compound (D) | | d11 | — | — | — |
| | | d12 | — | — | — |
| | | d13 | — | — | 3.62 |
| | | d14 | — | — | — |
| | | d15 | — | — | — |
| | | d16 | — | — | — |
| | | d17 | — | — | — |
| | | d18 | — | — | — |
| Inorganic filler (C) | | | 87.81 | 87.81 | 87.81 |
| Pigment | | | 0.51 | 0.51 | 0.51 |
| Flame retardant | | | 0.10 | 0.10 | 0.10 |
| Silane coupling agent | | | 0.15 | 0.15 | 0.15 |
| Release agent | | | 0.25 | 0.25 | 0.25 |
| Characteristics of silicone compound | Specific gravity | | — | — | 1.25 |
| | Alkoxy group amount (wt %) | | — | — | 0 |
| CTE2 Reduction ratio (ppm/wt %) | | | — | −3.04 | −0.04 |
| Effect of decreasing CTE2 | | | — | B | C |
| Modulus at 260° C. (GPa) | | | 1.31 | 2.32 | 1.47 |
| Degree of effect on modulus | | | A | B | A |
| Reduction ratio of warpage variation (%/wt %) | | | — | −8.77 | −0.13 |
| Effect of decreasing warpage variation at reflow | | | — | B | C |

As seen from the results in Tables 5 and 6, also in the resin system 2 (Table 5) and the resin system 3 (Table 6) where the combination of the epoxy resin and the phenol resin was changed from that in the resin system 1 (see, Table 4), both of the epoxy resin compositions containing a silicone compound having an alkoxy group amount and a specific gravity with at least either one being out of the specific range specified in the present invention (Comparative Examples 12 and 14) have a small effect of decreasing the linear expansion coefficient (CTE2) and in turn, also a low effect of decreasing the warpage variation at reflow.

It is understood from Tables 1 to 6 that in the products of Examples 1 to 11, the linear expansion coefficient is decreased as compared with the product of Comparative Example 1 obtained by adding a conventional inorganic filler or the products of Comparative Examples 2 to 10 containing a silicone compound having an alkoxy group amount and a specific gravity with at least either one being out of the specific range specified in the present invention and also, the degree of increase in the high-temperature modulus is reduced as compared with the product of Comparative Example 1, revealing that generation of warpage is suppressed. Similarly, also in the products of Examples 12 and 13, it is understood that the generation of warpage is suppressed as compared with the products of Comparative Examples 11 and 13 obtained by adding a conventional inorganic filler or the products of Comparative Examples 12 and 14 containing a silicone compound having an alkoxy group amount and a specific gravity with at least either one being out of the specific range specified in the present invention.

In this way, as proved in Examples above, the epoxy resin composition for semiconductor encapsulation of the present invention has a marked effect of decreasing the thermal stress and in turn, provides an effect of greatly decreasing the warpage variation at reflow and significantly enhancing the soldering resistance. Accordingly, when a single-sided resin encapsulation-type package by a molded array packaging system or an electronic component such as SOP is resin-encapsulated by using the epoxy resin composition for semiconductor encapsulation of the present invention, an electronic product having high reliability can be obtained.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2011-162305 filed on Jul. 25, 2011, and the contents are incorporated herein by reference.

All references cited herein are incorporated by reference herein in their entirety.

The epoxy resin composition for semiconductor encapsulation of the present invention can decrease the high-temperature modulus and thermal expansion coefficient of an encapsulating resin formed using the composition and is effective in suppressing the generation of warpage and useful, for example, as an encapsulating material of a single-sided resin encapsulation-type package.

| Description of Reference Numerals and Signs | |
|---|---|
| 1 | Semiconductor element-mounting substrate (BT resin) |
| 2 | Semiconductor element (Si chip) |
| 3 | Encapsulating resin |
| 4 | Bonding wire |
| 5 | Solder terminal |

What is claimed is:

1. An epoxy resin composition for semiconductor encapsulation, comprising the following components (A) to (D):

(A) an epoxy resin;
(B) a phenol resin;
(C) an inorganic filler; and
(D) a silicone compound containing an alkoxy group directly bonded to silicon atom in an amount of 10 to 45 wt % based on the entire silicone compound and having a specific gravity of 1.10 to 1.30, wherein the silicone compound as the component (D) is contained in an amount of 0.5 to 5.0 wt % based on the entire epoxy resin composition.

2. The epoxy resin composition for semiconductor encapsulation according to claim 1, wherein the inorganic filler as the component (C) is contained in an amount of 70 to 92 wt % based on the entire epoxy resin composition.

3. The epoxy resin composition for semiconductor encapsulation according to claim 1, wherein the alkoxy group in the silicone compound as the component (D) contains at least a methoxy group.

4. The epoxy resin composition for semiconductor encapsulation according to claim 1, wherein the silicone compound as the component (D) has an organic substituent, and the organic substituent contains a phenyl group.

5. A semiconductor device obtained by resin-encapsulating a semiconductor element with the epoxy resin composition for semiconductor encapsulation according to claim 1.

6. The semiconductor device according to claim 5, which is a single-sided resin encapsulation-type package.

* * * * *